United States Patent
Moosburger et al.

(10) Patent No.: US 9,799,795 B2
(45) Date of Patent: Oct. 24, 2017

(54) METHOD FOR PRODUCING AN ASSEMBLY EMITTING ELECTROMAGNETIC RADIATION, AND ASSEMBLY EMITTING ELECTROMAGNETIC RADIATION

(71) Applicant: OSRAM Opto Semiconductors GmbH, Regensburg (DE)

(72) Inventors: Jürgen Moosburger, Lappersdorf (DE); Axel Kaltenbacher, Mintraching (DE); Matthias Wolf, Regensburg (DE); Georg Dirscherl, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 35 days.

(21) Appl. No.: 14/780,470

(22) PCT Filed: Mar. 19, 2014

(86) PCT No.: PCT/EP2014/055546
§ 371 (c)(1),
(2) Date: Sep. 25, 2015

(87) PCT Pub. No.: WO2014/154551
PCT Pub. Date: Oct. 2, 2014

(65) Prior Publication Data
US 2016/0043271 A1 Feb. 11, 2016

(30) Foreign Application Priority Data
Mar. 25, 2013 (DE) .................. 10 2013 205 179

(51) Int. Cl.
*H01L 33/00* (2010.01)
*H01L 33/50* (2010.01)

(52) U.S. Cl.
CPC ........ *H01L 33/0095* (2013.01); *H01L 33/505* (2013.01); *H01L 33/508* (2013.01); *H01L 33/504* (2013.01); *H01L 2933/0041* (2013.01)

(58) Field of Classification Search
CPC . H01L 33/0095; H01L 33/505; H01L 33/508; H01L 33/504
See application file for complete search history.

(56) References Cited

U.S. PATENT DOCUMENTS 6,747,406 B1   6/2004   Bortscheller et al.
7,462,878 B2   12/2008  Richter et al.
(Continued)

FOREIGN PATENT DOCUMENTS

CN   101809778 A   8/2010
CN   102177594 A   9/2011
(Continued)

*Primary Examiner* — Seahvosh Nikmanesh
(74) *Attorney, Agent, or Firm* — Slater Matsil, LLP

(57) ABSTRACT

In various exemplary embodiments, a method is provided for producing an assembly emitting electromagnetic radiation. In this case, a component composite structure is provided which has components emitting electromagnetic radiation, which components are coupled to one another physically in the component composite structure. In each case at least one component-individual property is imparted to the components. Depending on the determined properties of the components, a structure mask for covering the components in the component composite structure is formed, wherein the structure mask has structure mask cutouts corresponding to the components, which structure mask cutouts are formed in component-individual fashion depending on the properties of the corresponding components. The structure mask cutouts provide phosphor regions, which are exposed in the structure mask cutouts, on the components. Phosphor layers are formed on the phosphor regions of the components.

15 Claims, 3 Drawing Sheets

(56) References Cited

U.S. PATENT DOCUMENTS

| | | |
|---|---|---|
| 7,910,387 B2 | 3/2011 | Chao |
| 7,982,233 B2 | 7/2011 | Berben et al. |
| 8,349,628 B2 * | 1/2013 | Chen .................. H01L 33/505 |
| | | 257/E33.061 |
| 8,410,507 B2 | 4/2013 | Stauss et al. |
| 8,476,091 B2 | 7/2013 | Hiller et al. |
| 8,877,524 B2 | 11/2014 | Chitnis et al. |
| 8,901,592 B2 * | 12/2014 | Weidner ................ H01L 33/60 |
| | | 257/98 |
| 8,987,708 B2 | 3/2015 | Schindler et al. |
| 9,105,771 B2 * | 8/2015 | Weidner ............. H01L 33/0095 |
| 9,362,258 B2 * | 6/2016 | Moosburger ....... H01L 25/0753 |
| 9,484,508 B2 * | 11/2016 | Dirscherl ............... H01L 33/56 |
| 9,559,266 B2 * | 1/2017 | Wirth .................... H01L 24/19 |
| 2006/0071223 A1 | 4/2006 | Richter et al. |
| 2009/0261358 A1 | 10/2009 | Chitnis et al. |
| 2009/0272998 A1 | 11/2009 | Berben et al. |
| 2010/0081218 A1 | 4/2010 | Hardin |
| 2010/0252845 A1 | 10/2010 | Lin et al. |
| 2010/0276706 A1 * | 11/2010 | Herrmann ........... H01L 33/0079 |
| | | 257/89 |
| 2010/0308362 A1 * | 12/2010 | Herrmann ............... H01L 33/44 |
| | | 257/98 |
| 2011/0070669 A1 | 3/2011 | Hiller et al. |
| 2011/0121344 A1 | 5/2011 | Donofrio |
| 2013/0337593 A1 | 12/2013 | Gallmeier et al. |

FOREIGN PATENT DOCUMENTS

| | | |
|---|---|---|
| CN | 102473704 | 5/2012 |
| DE | 102004047727 A1 | 4/2006 |
| DE | 102011013369 A1 | 7/2012 |
| EP | 2503605 A2 | 9/2012 |
| EP | 2541631 A2 | 1/2013 |
| JP | 2004363343 A | 12/2004 |
| JP | 2005508093 A | 3/2005 |
| JP | 2009060077 A | 3/2009 |
| JP | 2009537996 A | 10/2009 |
| JP | 2010245515 A | 10/2010 |
| JP | 2011517090 A | 5/2011 |
| JP | 2013508995 A | 3/2013 |

* cited by examiner

METHOD FOR PRODUCING AN ASSEMBLY EMITTING ELECTROMAGNETIC RADIATION, AND ASSEMBLY EMITTING ELECTROMAGNETIC RADIATION

This patent application is a national phase filing under section 371 of PCT/EP2014/055546, filed Mar. 19, 2014, which claims the priority of German patent application 10 2013 205 179.4, filed Mar. 25, 2013, each of which is incorporated herein by reference in its entirety.

TECHNICAL FIELD

The invention relates to a method for producing an electromagnetic radiation emitting assembly, and to an electromagnetic radiation emitting assembly.

BACKGROUND

In the case of a conventional electromagnetic radiation emitting assembly, called assembly hereinafter, white light can be generated by means of additive color mixing. For this purpose, by way of example a material comprising phosphor can be applied to an electromagnetic radiation emitting component, called component hereinafter, for example, an LED. The material comprising phosphor, which can also be referred to as converting material or conversion material, converts the electromagnetic radiation generated by the component with regard to its wavelength. By way of example, blue light can be generated by means of the component and can be converted into yellow light by means of the conversion material. The mixture of converted, for example, yellow, and non-converted, for example, blue, light then appears white.

The assemblies are firstly produced in a component assemblage comprising a plurality of the components. The component assemblage can be a wafer, for example. The properties of the individual components, for example, of the LEDs, in a wafer differ from one another. The properties are, for example, physical properties, for example, forward voltages, wavelengths of the generated light and/or brightnesses of the generated light. In this regard, one component of a wafer can generate light having a different brightness than another component of the same wafer under otherwise identical boundary conditions. The properties of a component are thus individual and are therefore also referred to hereinafter as component-individual properties.

After the singulation of the components from the component assemblage, the material comprising phosphor, for example, in the form of phosphor layers, for example, in the form of phosphor laminae, can be applied to the components. One of the assemblies is formed by at least one component with at least one phosphor layer. However, the phosphor layers cannot be applied to all the components exactly identically. As a result, the amount of phosphor required for the white conversion can vary from component to component.

If the properties of the components deviate from one another, in the case of the corresponding assemblies this can result in different color loci for the generated light, even if the amounts of phosphor and/or, for example, the thicknesses of the phosphor layers are identical in the case of the corresponding assemblies. If the amounts of phosphor deviate even only slightly from one another, in the case of the corresponding assemblies this can likewise result in different color loci for the generated light, even if the properties of the components are identical.

It is known, in order nevertheless to obtain assemblies with which identical or at least very similar color loci are achievable, to sort the components according to their component-individual properties, for example, into so-called bins. The conversion material is applied by means of screen printing or molding methods, for example, in which conversion laminae are produced for the respective component geometries and are likewise sorted into bins in accordance with their properties. By way of example, the degree of conversion of the phosphor laminae is measured as a property. This is followed by determining which phosphor laminae match which components in order that as many of the assemblies as possible generate light having the desired color and/or the desired color locus. After, the matching phosphor lamina is adhesively bonded onto the correct component.

Furthermore, it is known to produce only a partial covering of the phosphor layer on a phosphor region of a component, but these partial coverings are always identical geometrically and are not adapted to the properties of the component.

SUMMARY

Embodiments of the invention provide a method for producing an electromagnetic radiation emitting assembly. In the method, a component assemblage is provided, which comprises electromagnetic radiation emitting components. The components are physically coupled to one another in the component assemblage. In each case at least one component-individual property is determined for the components. A structure mask for covering the components in the component assemblage is formed depending on the determined properties of the components. The structure mask has structure mask cutouts corresponding to the components, said structure mask cutouts being formed component-individually depending on the determined properties of the corresponding components. The structure mask cutouts predefine phosphor regions, which are uncovered in the structure mask cutouts, on the components. Phosphor layers are formed on the phosphor regions of the components. The structure mask is removed from the component assemblage. The components are singulated from the component assemblage. An assembly is formed by at least one of the singulated components and by at least one phosphor layer formed thereon.

The walls of the component-individual structure mask cutouts form a component-assemblage-individual structure mask. In other words, for each component assemblage, for example, for each wafer, an individual structure mask is formed, to be precise depending on the component-individual properties of the components of the corresponding component assemblage. The component-individual structure mask cutouts have the effect that the phosphor layer and thus also the amount of phosphor can be set individually for each component in the component assemblage. By way of example, diameter, number, size, shape and/or side lengths of the structure mask cutouts can be varied individually from component to component, as a result of which the area dimensions of the phosphor regions which are uncovered in the structure cutouts, and thus, given an identical thickness of the phosphor layers, the volume dimensions of the phosphor layers which are formed in the structure cutouts, and thus the amounts of phosphor per component are varied. By means of individually forming the phosphor layers, it is possible for the phosphor layers to be formed in a manner matching the corresponding components such that the same or at least approximately the same color locus is achievable by means of different components of the same component assemblage, even if the properties of the component deviate from one another. Measurement of phosphor laminae and allocation of the phosphor laminae to components matching them can be dispensed with.

For determining the component-individual structure cutouts and thus the component-assemblage-individual structure mask, the data corresponding to the properties of the components can be stored and then processed further. The amounts of phosphor and/or phosphor layers required for the individual components can be determined depending on the data by means of a suitable software program. The shapes and sizes of the structure mask cutouts and thus also the structure mask itself can then be determined depending on the required amounts of phosphor and/or phosphor layers.

The fact that the component assemblage is provided can mean, for example, that the component assemblage is formed. The component assemblage is formed, for example, by a wafer having a plurality of layers and contact areas. The fact that the components in the component assemblage are physically coupled to one another can mean, for example, that they are formed at least partly integrally. By way of example, a substrate of the components and/or individual layers of the components can extend over the entire component assemblage. The fact that the properties to be determined are component-individual can mean, for example, that at least one property is different from component to component. The properties can be, for example, the forward voltage, the generated brightness and/or the generated wavelength. By way of example, light having different wavelengths and/or having a different brightness can be generated by means of two components of a component assemblage under otherwise identical test conditions. The fact that the structure mask is formed can mean, for example, that the structure mask is first formed and then arranged on the component assemblage, or that the structure mask is formed directly on the component assemblage. The phosphor layers can also be referred to as first phosphor layers.

The structure mask cutouts extend as far as the surfaces of the components and define the phosphor regions of the components. In other words, the structure mask cutouts are used to predefine how the phosphor regions are formed and where a phosphor layer is applied to the component, and where not.

The structure mask can be removed from the component assemblage in an etching method, for example. The components can be singulated from the component assemblage, for example, by means of cutting or sawing, for example, by means of a laser. An assembly can be formed by one, two or more of the singulated components and by in each case at least one phosphor layer formed thereon.

In various embodiments, the structure mask is formed directly on the component assemblage. This can contribute to the structure mask being formed precisely, simply and/or cost-effectively. As an alternative thereto, the structure mask can first be formed and subsequently arranged on the component assemblage.

In various embodiments, the structure mask comprises a photolithographically patternable material, which firstly is applied areally to the component assemblage. The areally applied material is exposed depending on the properties determined. The exposure can be carried out, for example, by means of a laser direct exposer depending on the data representing the properties. After—depending on the type of photolithographically patternable material—the exposed regions or the non-exposed regions of the structure mask are removed, in particular in such a way that the structure mask cutouts arise. This can contribute to the structure mask being formed precisely, simply and/or cost-effectively. The photolithographically patternable material can, for example, be a resist and/or be applied to the component assemblage in the form of a film. The photolithographically patternable material can be applied with a predefined thickness, for example. The thickness can be in a range of, for example, 10 µm to 200 µm, for example, 40 µm to 60 µm, for example, approximately 50 µm.

In various embodiments, the structure mask is applied to the component assemblage in a patterned fashion by means of a printing method. This can contribute to the structure mask being formed precisely, simply and/or cost-effectively. The fact that the structure mask is applied in a patterned fashion can mean, for example, that the structure of the structure mask is formed directly during the process of applying the material of the structure mask to the component assemblage. This is in contrast to firstly applying material areally and subsequently patterning the material.

In various embodiments, the phosphor layers are applied by means of blade coating. During subsequent removal of the structure mask, the material comprising phosphor on the structure mask can also be removed. As an alternative thereto, the material comprising phosphor on the structure mask can firstly be removed on the structure mask and the uncovered structure mask can be removed afterward. By way of example, a phosphor-silicone mixture can be used as material for the phosphor layers. By way of example, the material comprising the phosphor or the phosphors is applied to the structure mask and to the phosphor regions of the components.

In various embodiments, the phosphor layers are applied by means of spraying, for example, spray coating. By way of example, the material comprising the phosphor or the phosphors is sprayed onto the structure mask and onto the phosphor regions of the components. During subsequent removal of the structure mask, the material comprising phosphor on the structure mask is then also removed. As an alternative thereto, the material comprising phosphor on the structure mask can firstly be removed and the uncovered structure mask can be removed afterward. By way of example, a converter mixture comprising the phosphor or the phosphors, a polymer and a solvent can be used as material for the phosphor layers.

In various embodiments, the phosphor layers are dried and/or hardened before the structure mask is removed. The drying and/or hardening can be carried out, for example, at temperatures of between 50 degrees and 150 degrees Celsius, for example, between 70 degrees and 130 degrees Celsius, for example, between 90 degrees and 110 degrees Celsius. The hardening and/or drying can contribute to the phosphor layers remaining intact or at least approximately intact during the removal of the structure mask.

In various embodiments, the phosphor layers and/or the structure mask are at least partly removed after the application of the phosphor layers and/or after the drying and/or hardening of the phosphor layers. The removal of the phosphor layers, if the phosphor layers also cover the structure mask, can contribute to the structure mask being uncovered, such that the latter can subsequently be removed in a simple manner. Furthermore, the removal of the phosphor layers above the corresponding phosphor regions can contribute to the thicknesses of the corresponding phosphor layers being set precisely. The phosphor layers then have, in the case of different lateral dimensions, that is to say parallel to the surface of the components, the same layer thicknesses perpendicular to the surface of the components. This can contribute to the fact that with the corresponding components the desired color locus can subsequently be achieved precisely. The material of the phosphor layers can be chosen from the outset such that post-processing of this type is possible in a simple manner.

In various embodiments, two or more structure mask cutouts spaced apart from one another are formed for at least one component in the component assemblage. In other words, in the two or more structure mask cutouts, correspondingly two or more phosphor regions of a component are uncovered. The corresponding component then has two or more phosphor regions. This can contribute to the color locus being able to be set particularly precisely.

In various embodiments, two or more phosphor layers spaced apart from one another are formed for at least one component in the component assemblage, for example, by means of the correspondingly two or more structure mask cutouts for the corresponding component. This can contribute to the color locus being able to be set particularly precisely.

In various embodiments, in the case of at least one component in the component assemblage, at least one further phosphor layer, for example, a second phosphor layer, is formed between the phosphor layers of the corresponding component. The further phosphor layer can comprise, for example, different phosphors or the same phosphors in a different concentration than the first phosphor layers. Furthermore, the further phosphor layer can comprise a different carrier material in which the phosphors are embedded. This can contribute to different color loci being able to be achieved and/or to the corresponding color loci being able to be set particularly precisely. The second phosphor layer can be formed in such a way that a shape of the second phosphor layer can be predefined by a shape of the cavities formed between the first phosphor layers. If the cavities are roundish, for example, circular or oval, then the second phosphor layers can accordingly be formed such that they are roundish or circular or oval. If the cavities are polygonal, for example, rectangular, for example, square, then the second phosphor layers can accordingly be formed such that they are polygonal, rectangular or square.

In various embodiments, the phosphor layers are formed in a strip-shaped fashion on at least one component.

In various embodiments, the phosphor layers are formed in a lattice-shaped fashion on at least one component. The lattice shape of the phosphor layers can have rows and columns. Cavities are formed between the rows and columns. The lattice shape can be formed in such a way that the cavities are roundish, for example, circular or oval, or polygonal, for example, rectangular or square.

In various embodiments, an electromagnetic radiation emitting assembly is provided which was produced with the aid of a method according to any of the preceding claims.

In various embodiments, an electromagnetic radiation emitting assembly is provided, for example, the electromagnetic assembly explained above. The electromagnetic radiation emitting assembly comprises an electromagnetic radiation emitting component having at least one component-individual property. At least one phosphor layer whose shape and size are formed depending on the component-individual property is formed on the component.

BRIEF DESCRIPTION OF THE DRAWINGS

Exemplary embodiments of the invention are illustrated in the figures and are explained in greater detail below.

In the figures.

DETAILED DESCRIPTION OF ILLUSTRATIVE EMBODIMENTS

In the following detailed description, reference is made to the accompanying drawings, which form part of this description and show for illustration purposes specific exemplary embodiments in which the invention can be implemented. In this regard, direction terminology such as, for instance, "at the top", "at the bottom", "at the front", "at the back", "front", "rear", etc. is used with respect to the orientation of the figure(s) described. Since component parts of exemplary embodiments can be positioned in a number of different orientations, the direction terminology serves for illustration and is not restrictive in any way whatsoever. It goes without saying that other exemplary embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various exemplary embodiments, an electromagnetic radiation emitting assembly can comprise an electromagnetic radiation emitting component and at least one phosphor layer on the electromagnetic radiation emitting component. In various exemplary embodiments, an electromagnetic radiation emitting component can be an electromagnetic radiation emitting semiconductor component and/or can be formed as an electromagnetic radiation emitting diode, as an organic electromagnetic radiation emitting diode, as an electromagnetic radiation emitting transistor or as an organic electromagnetic radiation emitting transistor. The radiation can be, for example, light in the visible range, UV light and/or infrared light. In this context, the electromagnetic radiation emitting component can be formed, for example, as a light emitting diode (LED), as an organic light emitting diode (OLED), as a light emitting transistor or as an organic light emitting transistor. In various exemplary embodiments, the light emitting component can be part of an integrated circuit. Furthermore, a plurality of light emitting components can be provided, for example, in a manner accommodated in a common housing. The electromagnetic radiation emitting component is referred to hereinafter as component. The electromagnetic radiation emitting assembly is referred to hereinafter as assembly.

Figure 1:
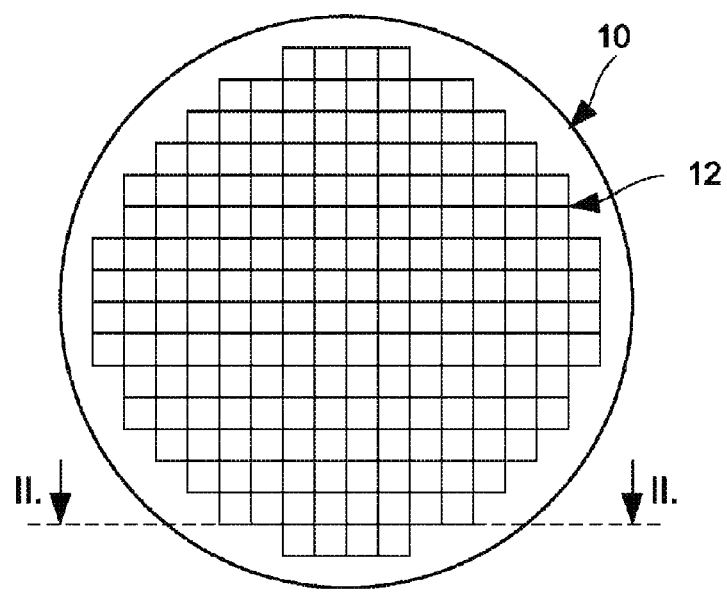
FIG. 1 shows a plan view of one exemplary embodiment of a component assemblage in a first state during a method for producing an electromagnetic radiation emitting assembly.

FIG. 1 shows a plan view of one exemplary embodiment of a component assemblage 10 in a first state during a method for producing electromagnetic radiation emitting assemblies. The component assemblage 10 comprises a plurality of components 12. The component assemblage 10 can comprise more or fewer than the components 12 shown in FIG. 1. The component assemblage 10 is formed such that it is roundish, in particular circular, in plan view. The components 12 are formed such that they are polygonal, in particular rectangular, in particular square, in plan view. As an alternative thereto, both the component assemblage 10 and the components 12 can be formed differently in plan view. By way of example, the component assemblage 10 can be shaped in a polygonal fashion, for example, in a rectangular fashion or in a square fashion, and/or the components 12 can be formed such that they are roundish, for example, oval or circular. The component assemblage 10 can for example, be a wafer and/or substantially comprise semiconductor material and/or be formed therefrom.

The components are suitable for emitting electromagnetic radiation, for example, for emitting blue light. Moreover, the components are suitable for taking up phosphor layers, wherein at least one component and at least one phosphor layer formed thereon form an electromagnetic radiation emitting assembly.

Figure 2:
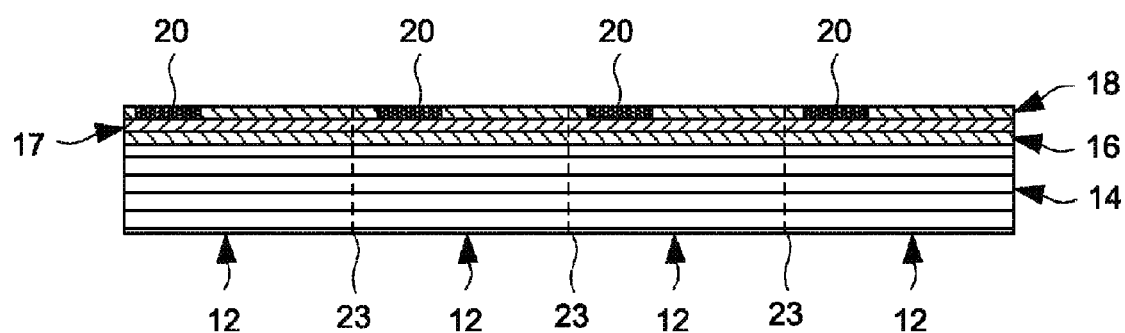
FIG. 2 shows a sectional illustration of the component assemblage in accordance with FIG. 1 along the line II.-II.

FIG. 2 shows a sectional illustration of the component assemblage 10 in accordance with FIG. 1 along the line II-II shown in FIG. 1. The component assemblage 10 comprises a substrate 14, a bottom electrode layer 16, an optically active layer 17 and a top electrode layer 18. Furthermore, each component 12 has a contact region 20 in the top electrode layer 18. The top electrode layer 18 is suitable for taking up a phosphor layer (not shown in FIG. 2). That region of the top electrode layer 18 in which the phosphor layer is applied can also be referred to as a phosphor region (not shown in FIG. 2). The contact region 20 is suitable for electrically contacting the corresponding component 12.

When a voltage is applied to the bottom and top electrode layers 16, 18, electromagnetic radiation is generated in the optically active layer 17 and is emitted in a direction away from the substrate 14, for example, upward in FIG. 2. A color locus that can be achieved by means of the electromagnetic radiation of one of the assemblies results from the properties of the corresponding component 12, the shape and/or size of the corresponding phosphor region, the thickness of the corresponding phosphor layer and the concentration of the phosphors in the phosphor layer.

The phosphors of one of the phosphor layers are energetically excited with the aid of the electromagnetic radiation generated by the corresponding component 12, which can also be referred to as excitation radiation in this context. The excitation radiation can comprise blue light, for example. Upon subsequent energetic deexcitation, the phosphors emit light of one or a plurality of predefined colors. A conversion of the excitation radiation thus takes place, as a result of which conversion radiation is generated. During the conversion, the wavelengths of the excitation radiation are shifted toward shorter or longer wavelengths. The colors can be individual colors or mixed colors and correspond to a specific color locus. The individual colors can comprise, for example, green, red or yellow light and/or the mixed colors can be mixed, for example, from green, red and/or yellow light and/or comprise white light, for example. In addition, blue light can be provided, for example, by the phosphor layer being formed in such a way that at least partly non-converted excitation radiation leaves the assembly as usable illumination light. The individual or mixed colors can be represented with the aid of the phosphor layer and the corresponding component 12. By way of example, green, red and yellow can be represented with the aid of blue excitation light. With the use of UV light as excitation light, the phosphors can also be chosen such that they represent red, green, blue and yellow.

After finished processing of the component assemblage 10, the individual components 12 can be singulated along separating lines 23. As an alternative thereto, it is also possible for a plurality of components 12 not to be separated from one another and to form different elements of an assembly.

The components 12 can already be contacted, operated and/or measured in the component assemblage 10 prior to singulation. In particular, component-individual properties of the individual components 12 can already be determined in the component assemblage 10. By way of example, for each component 12, as component-individual property, the corresponding forward voltage, the generated wavelength and/or the generated brightness can be determined, under otherwise predefined boundary conditions, for example, identical boundary parameters. In other words, the components 12 in the component assemblage 10 can be operated under identical conditions, but then exhibit properties deviating individually from one another, which properties can already be detected in the component assemblage 10.

Data representing the component-individual properties can be stored on an electronic storage element (not illustrated). Depending on the stored data, for example, by means of a software program, for each component 12 individually an amount of phosphor can be determined which is required in order that a desired color locus is achievable by means of the corresponding phosphor layer and the corresponding component 12. Depending on the amount of phosphor determined and for a predefined thickness of the phosphor layer, for each component 12 an individual phosphor region on the corresponding component 12 can then be determined which has to be coated with phosphor material having the predefined thickness in order that the corresponding component 12 with the corresponding phosphor layer can achieve the predefined color locus.

Figure 3:
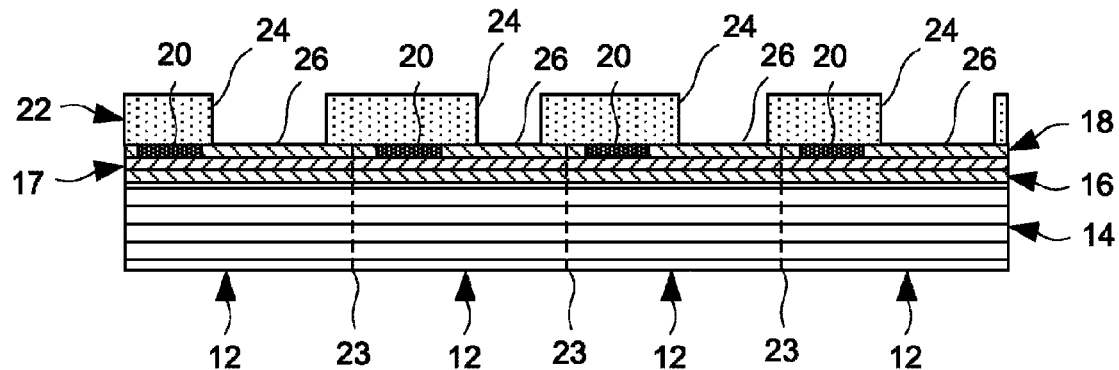
FIG. 3 shows the component assemblage in accordance with FIG. 2 in a second state during the method for producing the electromagnetic radiation emitting assembly.

FIG. 3 shows the component assemblage 10 in accordance with FIG. 2 during a second state of the method for producing the assembly, in which a structure mask 22 is formed on the second electrode layer 18. The structure mask 22 is formed depending on the amounts of phosphor determined or the phosphor regions determined. In particular, structure mask cutouts 24 of the structure mask 22 can be formed in such a way that phosphor regions 26 on the components 12 of the component assemblage 10 remain free of the material of the structure mask 22. In other words, the phosphor regions 26 of the individual components 12 are uncovered in the structure cutouts 24, wherein the structure cutouts 24 correspond to the phosphor regions 26.

FIG. 3 reveals that the phosphor regions 26 can be formed differently, for example, with different sizes, lengths and/or widths. For the sake of better elucidation, the differences between the phosphor regions 26 are illustrated as relatively large in FIG. 3. The sizes and/or shapes of the phosphor regions 26 can actually also be significantly smaller, however. The differences between the phosphor regions 26 result from the differences in the properties and thus from the component-individual properties of the individual components 12.

The structure mask 22 can, for example, first be produced and then arranged on the component assemblage 10. As an alternative thereto, the structure mask 22 can be formed directly on the component assemblage 10. The structure mask 22 can comprise a photolithograpically patternable material, for example. The photolithograpically patternable material can be applied to the component assemblage 10, for example, in the form of a resist and/or in the form of a film, can then be exposed, for example, laser-exposed, depending on the data representing the properties of the components 12 and subsequently, in a lift-off method, the exposed or the non-exposed regions of the structure mask 22 can be removed, depending on what type of photolithograpically patternable material is used. As an alternative thereto, the structure mask 22 can be applied to the component assemblage 10 in a printing method, for example, in an inkjet printing method.

Figure 4:
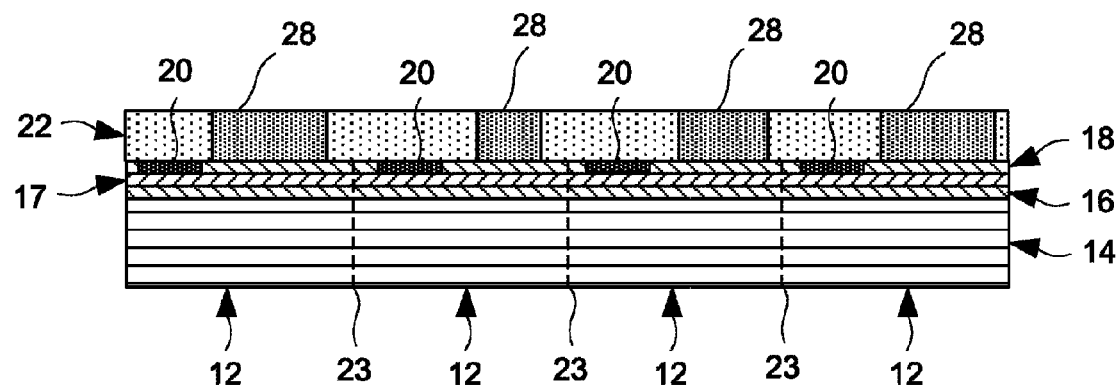
FIG. 4 shows the component assemblage in accordance with FIG. 2 in a third state during the method for producing the electromagnetic radiation emitting assembly.

FIG. 4 shows the component assemblage 10 in accordance with FIG. 2 in a third state during the method for producing the assembly. The phosphor layers, for example, first phosphor layers 28, are formed above the phosphor regions 26 and in the structure cutouts 24. The first phosphor layers 28 can be introduced into the structure cutouts 24 by means of blade coating, for example. As an alternative thereto, the material of the first phosphor layers 28 can firstly be applied areally to the phosphor regions 26 and the structure mask 22, be hardened and/or dried and subsequently be partly removed. The degrees of conversion of the individual first phosphor layers 28 depend on the thickness thereof, the area thereof parallel to the phosphor regions 26 and on the concentration of the phosphors in the corresponding first phosphor layer 28. Given an identical thickness of the first phosphor layers 28 and an identical concentration of the phosphors, the degree of conversion is thus determined by the size of the area parallel to the phosphor regions 26 and, consequently, by the size of the structure cutouts 24.

Customary phosphors are, for example, garnets or nitrides silicates, nitrides, oxides, phosphates, borates, oxynitrides, sulfides, selenides, aluminates, tungstates, and halides of aluminum, silicon, magnesium, calcium, barium, strontium, zinc, cadmium, manganese, indium, tungsten and other transition metals, or rare earth metals such as yttrium, gadolinium or lanthanum, which are doped with an activator such as, for example, copper, silver, aluminum, manganese, zinc, tin, lead, cerium, terbium, titanium, antimony or europium. In various embodiments, the phosphor is an oxidic or (oxy)nitridic phosphor such as a garnet, orthosilicate, nitrido(alumo)silicate, nitride or nitridoorthosilicate, or a halide or halophosphate. Specific examples of suitable phosphors are strontium chloroapatite:Eu ((Sr,Ca)5(PO4)3Cl:Eu; SCAP), yttrium aluminum garnet:cerium (YAG:Ce) or CaAlSiN3:Eu. Furthermore, the phosphor or phosphor mixture can contain particles having light-scattering properties and/or auxiliaries, for example. Examples of auxiliaries include surfactants and organic solvents. Examples of light-scattering particles are gold, silver and metal oxide particles.

Figure 5:
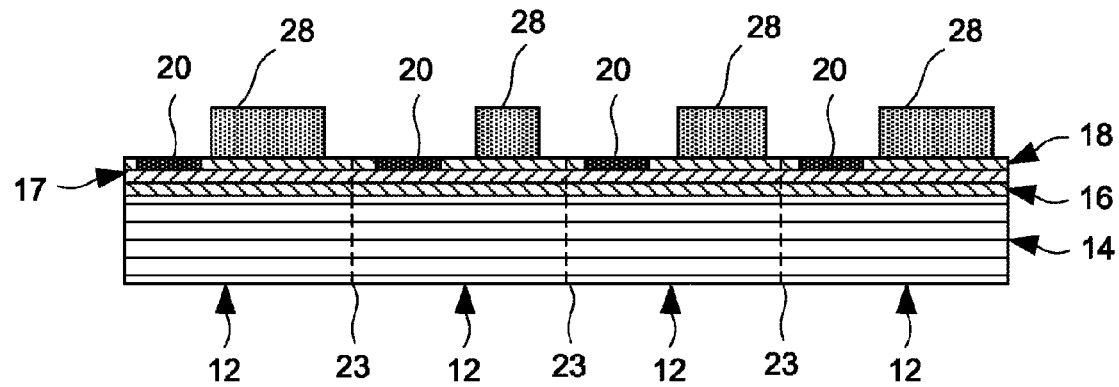
FIG. 5 shows the component assemblage in accordance with FIG. 2 in a third state during the method for producing the electromagnetic radiation emitting assembly.

FIG. 5 shows the component assemblage 10 in a fourth state during the method for producing the assembly, in which the structure mask 22 is removed. The structure mask 22 can be removed, for example, by means of a lift-off method, for example, by means of an etching process. The components 12 together with the corresponding first phosphor layers 28 form a plurality of assemblies and jointly form an assembly assemblage. Afterward, the individual assemblies can be singulated, for example, along the separating lines 23. As an alternative thereto, a plurality of the assemblies can be combined to form a common assembly. Each assembly comprises an individual combination of component 12 having component-individual properties and the corresponding first phosphor layer 28, wherein the same color locus is achievable by means of each of the assemblies.

Figure 6:
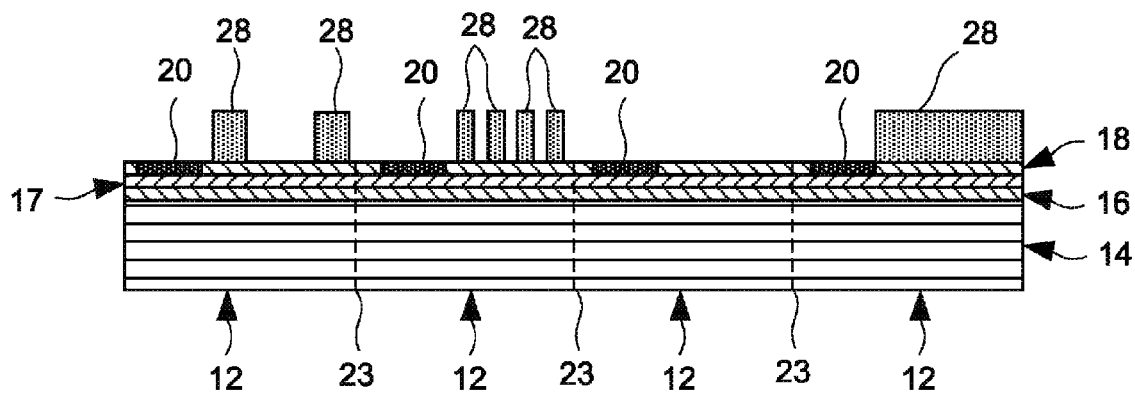
FIG. 6 shows a sectional illustration of one exemplary embodiment of a component assemblage.

FIG. 6 shows a sectional illustration of one exemplary embodiment of a component assemblage 10 which can be formed, for example, by means of the method explained above.

By way of example, the assembly shown on the far left in FIG. 6 comprises two phosphor layers 28. The first phosphor layers 28 can be formed in a strip-fashion, for example, into the plane of the drawing. Furthermore, there can additionally be cross-connections (not depicted) between the first phosphor layers 28, by means of which first phosphor layers 28 that are polygonal, for example, rectangular, for example, square or roundish, for example, oval or circular, in plan view are formed.

In contrast thereto, the second assembly from the left as shown in FIG. 6 comprises, for example, four first phosphor layers 28, which can be formed such that they are strip-shaped, polygonal or roundish in accordance with the first phosphor layers 28 of the assembly on the far left.

The second assembly from the right as shown in FIG. 6 comprises no first phosphor layer 28, for example. By way of example, during the measurement of the corresponding component 12, it may have been ascertained that by means of said component 12 the desired color locus is not achievable independently of the first phosphor layer 28 that can be applied. By way of example, the corresponding component cannot function at all or cannot function within a predefined range of parameters. In the former case, the corresponding assembly can be disposed of, without phosphor material being wasted for it. In the latter case, the corresponding component 12 can be supplied for a different use without first phosphor layer 28 or with a different phosphor layer (not illustrated), for example, in the form of a lamina.

The assembly shown on the far right in FIG. 6 is covered almost completely with the first phosphor layer 28 apart from the contact region 20.

Figure 7:
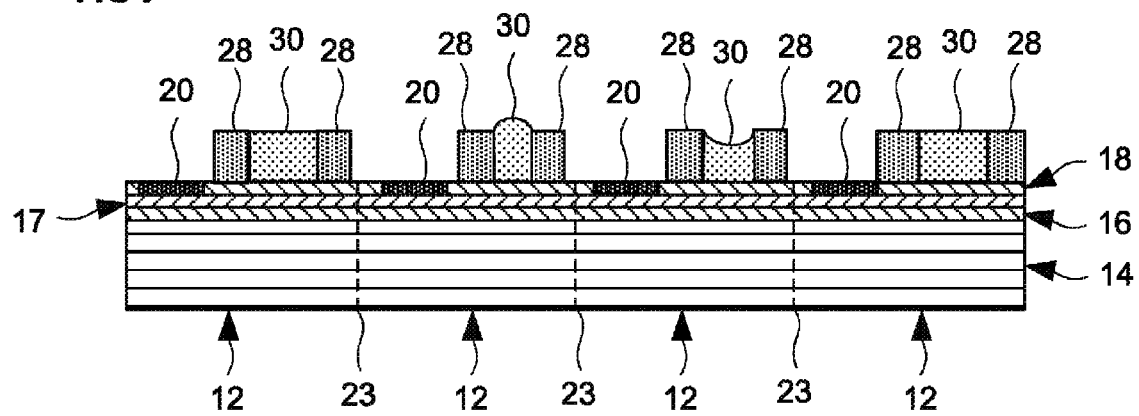
FIG. 7 shows a sectional illustration of one exemplary embodiment of a component assemblage.

FIG. 7 shows a sectional illustration through one exemplary embodiment of a component assemblage 10 in which further phosphor layers 30, in particular second phosphor layers 30, are formed between the first phosphor layers 28. The first phosphor layers 28 can comprise a different material than the second phosphor layers 30, for example. By way of example, the first phosphor layers 28 can comprise different phosphors than the second phosphor layers 30. Alternatively or additionally the first phosphor layers 28 can comprise the phosphors in a different concentration than the second phosphor layers 30. This can contribute to a different desired color locus being achieved or to the desired color locus being able to be set even more precisely.

The first phosphor layers 28 can serve as a mask for the material of the second phosphor layers 30 during application of the second phosphor layers 30. Alternatively or additionally, the first phosphor layers 28 can serve as the frame for the second phosphor layers 30. The first phosphor layers 28 can border cutouts, in particular cavities, that are roundish, for example, circular or oval, or polygonal, for example, rectangular or square, in plan view, for example, into which the material of the second phosphor layers 30 can then be filled. The shape of the second phosphor layers 30 is then predefined by the shape of the cavities, such that the second phosphor layers 30 are accordingly roundish, for example, circular or oval, or polygonal, for example, rectangular or square.

The material of the second phosphor layers 30 can be applied, for example, with a thickness identical to that of the material of the first phosphor layers 28 or the material of the second phosphor layers 30 can be applied such that the second phosphor layers 30 project convexly outward from the first phosphor layers 28, as in the case of the second assembly from the left as shown in FIG. 7, or project concavely inward, as in the case of the second assembly from the right as shown in FIG. 7.

The invention is not restricted to the exemplary embodiments shown. By way of example, more or fewer phosphor layers 28, 30 can be formed. Furthermore, the phosphor layers 28, 30 can be formed with different thicknesses. Furthermore, the components 12 in accordance with conventional LEDs can comprise far more than the layers shown. Moreover, the components 12 can comprise embedded electronic components (not shown) such as capacitors, transistors, etc. Furthermore, suitable methods different than those mentioned can be used for applying the structure mask 22 and/or the phosphor layers 28, 30.

The invention claimed is:

1. A method for producing an electromagnetic radiation emitting assembly, the method comprising:
   providing a component assemblage that comprises electromagnetic radiation emitting components that are physically coupled to one another in the component assemblage;
   determining a component-individual property of each component;
   forming a structure mask that covers the components in the component assemblage, wherein the structure mask has structure mask cutouts corresponding to the components, the structure mask cutouts being formed component-individually depending on the component-individual properties of the corresponding components, and wherein the structure mask cutouts predefine phosphor regions, which are uncovered in the structure mask cutouts, on the components;
   forming phosphor layers onto the phosphor regions of the components;
   removing the structure mask from the component assemblage; and
   singulating the components from the component assemblage.

2. The method according to claim 1, wherein an assembly is formed by at least one of the singulated components and by at least one phosphor layer formed thereon.

3. The method according to claim 1, wherein the structure mask is formed directly on the component assemblage.

4. The method according to claim 3, wherein forming the structure mask comprises:
   applying a photolithographically patternable material areally to the component assemblage;
   exposing the photolithographically patternable material depending on the component-individual properties; and
   removing portions of the photolithographically patternable material as a result of which the structure mask cutouts are formed, the removed portions being either exposed regions or non-exposed regions of the structure mask.

5. The method according to claim 3, wherein the structure mask is applied to the component assemblage in a patterned fashion by a printing method.

6. The method according to claim 1, wherein the phosphor layers are applied by blade coating.

7. The method according to claim 1, wherein the phosphor layers are applied by spraying.

8. The method according to claim 1, wherein the phosphor layers are dried or hardened before the structure mask is removed.

9. The method according to claim 8, wherein the phosphor layers are partly removed after the phosphor layers are dried or hardened.

10. The method according to claim 1, wherein the phosphor layers or the structure mask are partly removed after forming the phosphor layers.

11. The method according to claim 1, wherein two or more structure mask cutouts spaced apart from one another are formed for a component in the component assemblage.

12. The method according to claim 11, wherein two or more phosphor layers spaced apart from one another are formed for the component in the component assemblage.

13. The method according to claim 12, further comprising forming a further phosphor layer between the phosphor layers of the component in the component assemblage, the further phosphor layer having different properties than the phosphor layers.

14. The method according to claim 11, wherein the phosphor layers are formed in a strip-shaped fashion on at least one component.

15. The method according to claim 11, wherein the phosphor layers are formed in a lattice-shaped fashion on at least one component.

* * * * *